(12) United States Patent
Mao et al.

(10) Patent No.: US 8,796,152 B2
(45) Date of Patent: Aug. 5, 2014

(54) METHOD FOR MANUFACTURING A MAGNETORESISTIVE SENSOR

(71) Applicant: HGST Netherlands B.V., Amsterdam (NL)

(72) Inventors: Guomin Mao, San Jose, CA (US); Aron Pentek, San Jose, CA (US); Thao Pham, San Jose, CA (US); Yi Zheng, San Ramon, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/714,148

(22) Filed: Dec. 13, 2012

(65) Prior Publication Data

US 2014/0170774 A1  Jun. 19, 2014

(51) Int. Cl.
*H01L 21/461* (2006.01)
(52) U.S. Cl.
USPC ........... 438/712; 438/717; 438/723; 438/736; 438/744
(58) Field of Classification Search
USPC .................. 438/712, 717, 723, 724, 736, 744
See application file for complete search history.

(56) References Cited

U.S. PATENT DOCUMENTS

| | | | |
|---|---|---|---|
| 5,462,896 A * | 10/1995 | Komura et al. | 438/268 |
| 6,972,928 B2 | 12/2005 | Snyder et al. | |
| 7,398,592 B2 | 7/2008 | Le et al. | |
| 7,563,381 B2 | 7/2009 | Baer et al. | |
| 7,587,810 B2 | 9/2009 | Le | |
| 7,623,324 B2 | 11/2009 | Honda et al. | |
| 7,649,712 B2 | 1/2010 | Le et al. | |
| 7,710,685 B2 | 5/2010 | Kimura et al. | |
| 7,978,430 B2 | 7/2011 | Le et al. | |
| 8,191,238 B2 * | 6/2012 | Demtchouk et al. | 29/603.16 |
| 2009/0139958 A1 | 6/2009 | Pentek et al. | |
| 2010/0018947 A1 * | 1/2010 | Kimura et al. | 216/22 |
| 2012/0040531 A1 * | 2/2012 | Mao | 438/687 |
| 2012/0082800 A1 * | 4/2012 | Sakurai et al. | 427/526 |
| 2013/0029431 A1 * | 1/2013 | Takahashi et al. | 438/3 |

* cited by examiner

*Primary Examiner* — Binh X Tran
(74) *Attorney, Agent, or Firm* — Zilka-Kotab, PC (57) ABSTRACT

A method for manufacturing a magnetic sensor that allows the sensor to be constructed with a very narrow track width and with smooth, well defined side walls. A tri-layer mask structure is deposited over a series of sensor layers. The tri-layer mask structure includes an under-layer, a Si containing hard mask deposited over the under-layer and a photoresist layer deposited over the Si containing hard mask. The photoresist layer is photolithographically patterned to define a photoresist mask. A first reactive ion etching is performed to transfer the image of the photoresist mask onto the Si containing hard mask. The first reactive ion etching is performed in a chemistry that includes $CF_4$, $CHF_3$, $O_2$, and He. A second reactive ion etching is then performed in an oxygen chemistry to transfer the image of the Si containing hard mask onto the under-layer, and an ion milling is performed to define the sensor.

17 Claims, 10 Drawing Sheets

METHOD FOR MANUFACTURING A MAGNETORESISTIVE SENSOR

FIELD OF THE INVENTION

The present invention relates to magnetic data recording and more particularly to an improved method for manufacturing a magnetic read sensor having a reduced track-width and well defined side profile.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft under-layer of the magnetic medium to return to the return pole of the write head.

A magnetoresistive sensor such as a Giant Magnetoresistive (GMR) sensor or a Tunnel Junction Magnetoresivise (TMR) sensor can be employed to read a magnetic signal from the magnetic media. The sensor includes a nonmagnetic conductive layer (if the sensor is a GMR sensor) or a thin nonmagnetic, electrically insulating barrier layer (if the sensor is a TMR sensor) sandwiched between first and second ferromagnetic layers, hereinafter referred to as a pinned layer and a free layer. Magnetic shields are positioned above and below the sensor stack and can also serve as first and second electrical leads so that the electrical current travels perpendicularly to the plane of the free layer, spacer layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering of the conduction electrons is minimized and when the magnetizations of the pinned and free layer are antiparallel, scattering is maximized. In a read mode the resistance of the spin valve sensor changes about linearly with the magnitudes of the magnetic fields from the rotating disk. When a sense current is conducted through the spin valve sensor, resistance changes cause potential changes that are detected and processed as playback signals.

In order to maximize data density it is necessary to minimize the width (track-width) of the magnetoresistive sensor. In addition, it is important that the sensor be formed with well defined side edges in order to control sensor parameters such as free layer biasing. However, current manufacturing methods have limited the ability to construct well defined magnetic sensors at ever reduces track-widths.

SUMMARY OF THE INVENTION

The present invention provides a method for manufacturing a magnetic sensor. The method includes depositing a series of sensor layers, and depositing a series of mask layers over the series of sensor layers, the series of mask layers including an under-layer, a Si containing hard mask deposited over the under-layer and a photoresist layer deposited over the Si containing hard mask. The photoresist mask is photolithographically patterned to form a photoresist mask, and then a first reactive ion etching is performed to transfer the image of the photoresist mask onto the hard mask layer to form a patterned hard mask, the first reactive ion etching being performed in a chemistry that includes $CF_4$, $CHF_3$, $O_2$, and He. A second reactive ion etching is then performed to transfer the image of the patterned hard mask onto the under-layer to form a patterned under-layer mask, and an ion milling is performed to remove portions of the series of sensor layers that are not protected by the patterned under-layer mask.

This method, using a novel tri-layer mask and novel RIE processes results in a very well defined narrow mask and well defined narrow track-width sensor. The second reactive ion etching can be performed in an oxygen based chemistry, which can be predominantly $CO_2$. Use of this chemistry helps to reduce undercutting and footing of the under-layer.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
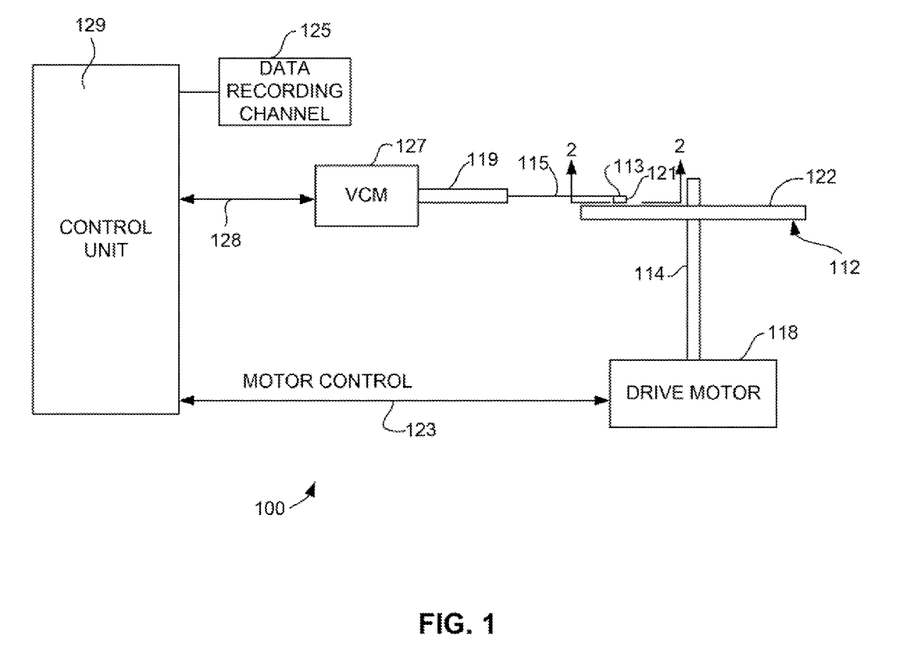
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
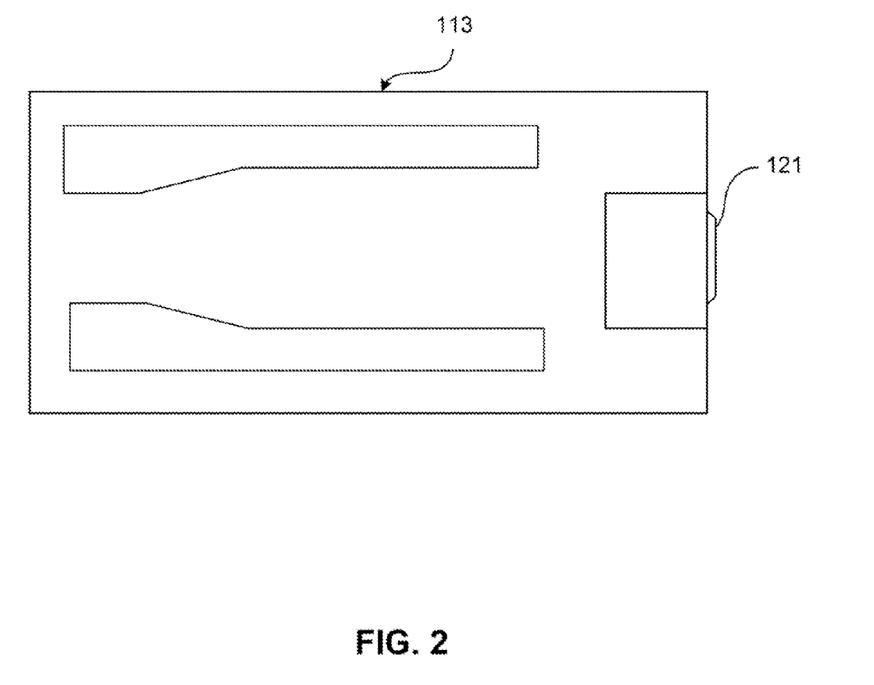
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
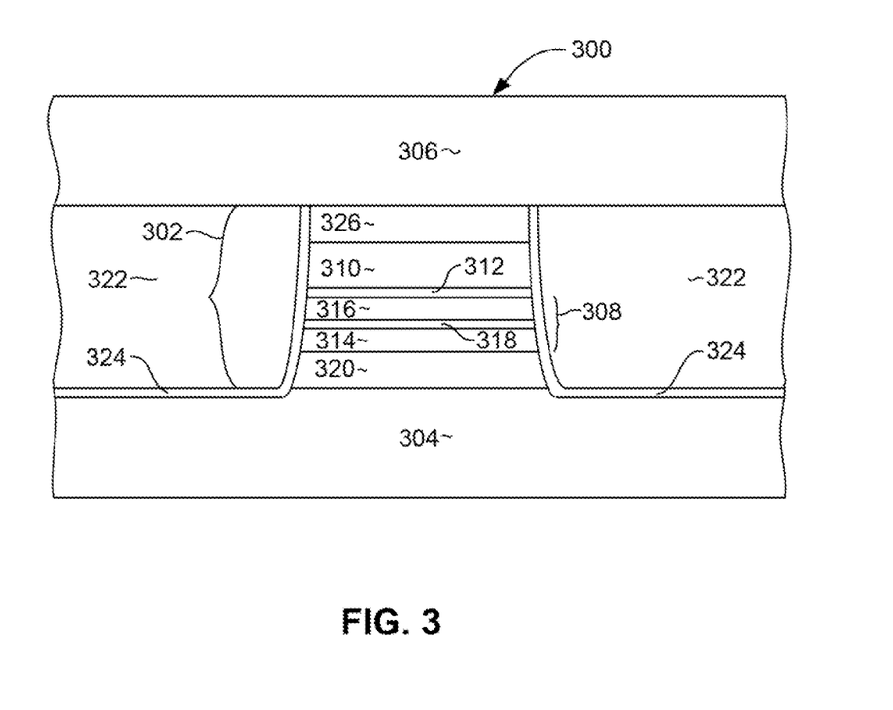
FIG. 3 is a schematic ABS view of a magnetic head according to a possible embodiment of the invention.

FIG. 3 shows a schematic view of a magnetic read head 300 as viewed from the air bearing surface (ABS). As seen in FIG. 3, the read head 300 can include a magnetoresistive sensor stack 302 that is sandwiched between first and second magnetic shields 304, 306 that can be constructed as electrically conductive, magnetic layers so that they can function as electrical leads as well as magnetic shields. The sensor stack can include a pinned layer structure 308, a magnetic free layer structure 310 and a thin non-magnetic, electrically insulating barrier layer (or electrically conductive spacer layer) 312 sandwiched there-between.

The pinned layer structure 308 can include first and second magnetic layers 314, 316 that are anti-parallel coupled across a non-magnetic anti-parallel coupling layer 318 there-between. The first magnetic layer 314 can be exchange coupled with a layer of antiferromagnetic material (AFM layer) 320, which strongly pins the magnetization of the first magnetic layer 314 in a desired first direction perpendicular to the air bearing surface. Anti-parallel coupling between the first and second magnetic layers 314, 316 pins the magnetization of the second magnetic layer 316 in a second direction that is opposite to that of the first magnetic layer 314 and which is also perpendicular to the air bearing surface.

The magnetic free layer 310 has a magnetization that is biased in a direction that is substantially parallel with the air bearing surface. Biasing of the magnetization of the free layer 310 can be provided by first and second hard magnetic bias layers 322. The hard magnetic bias layers 322 can each be separated from the sensor stack 302 and from the bottom shield 304 by a thin, electrically insulating layer 324 such as alumina or silicon nitride in order to prevent sense current from being shunted through the bias layers 322. The sensor stack 302 can also include a capping layer 326 at its top to protect the under-lying layers of the sensor stack from damage during manufacture.

The electrical resistance across the barrier layer 312 varies with the relative orientations of the magnetization of the free layer 310 and second magnetic layer 316 of the pinned layer structure 308. When the magnetizations of the layers 310, 316 are closer to being parallel with one another the resistance across the layer 312 is lower and when the magnetizations of the layers 310, 316 are closer to being anti-parallel to one another, the resistance increases. This change in resistance can be detected by processing circuitry in order to detect the presence of an external magnetic field (such as from a magnetic media) which causes the magnetization of the free layer to move (the magnetization of the layer 316 being pinned so that it does not move). The above description of a magnetoresistive sensor and its various layers is for purposes of illustration. Other read head structures are possible, and would fall within the scope of the invention.

In order to maximize data density it is necessary to minimize the width of the sensor stack 302 in order to minimize the track width of the system and thereby fit more tracks of data into a give area of magnetic media. FIGS. 4-10 show a read head in various intermediate stages of manufacture in order to illustrate a method for manufacturing a magnetic read head having such a reduced track width, and also having well defined side profiles for better track width control and free layer biasing.

Figure 4:
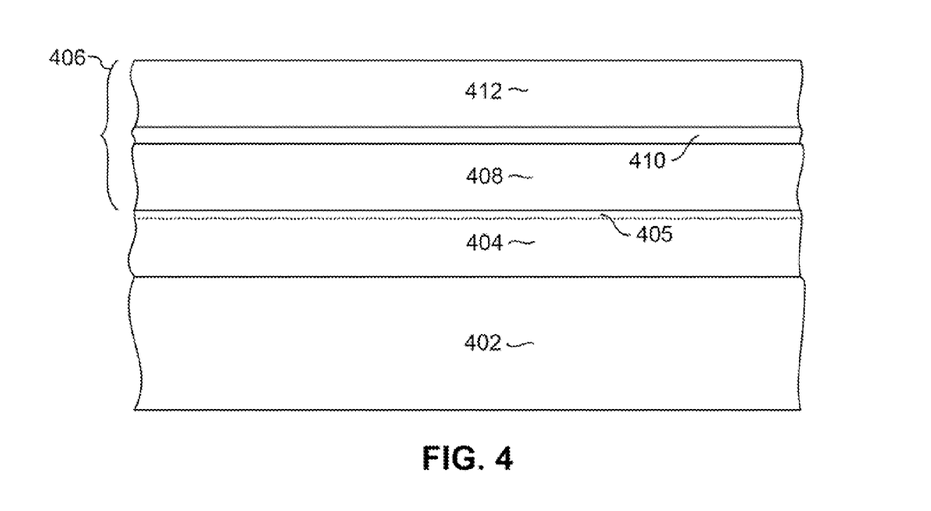
FIGS. 4-10 are views of a magnetic read head in various intermediate stages of manufacture, illustrating a method for manufacturing a magnetic read head according to an embodiment of the invention.

With reference to FIG. 4, a bottom shield 402 is constructed. This bottom shield can be constructed of a material such as Ni—Fe. The shield 402 can be constructed upon a substrate such as alumina (not shown). A series of sensor layers 404 are deposited over the shield 404. The sensor layers 404 can include layers such as those of the sensor stack 302 described above with reference to FIG. 3, but could include other additional or different layers as well. The series of sensor layers 404 can also include a layer of material that is resistant to chemical mechanical polishing (CMP stop layer) 405 as its topmost layer. The CMP stop layer 405 can be a material such as alumina or carbon.

With continued reference to FIG. 4, a tri-layer mask structure 406 is deposited over the CMP stop layer 405. The mask structure 406 includes an under-layer 408, a silicon containing hard mask 410 and a layer of photoresist material 412. The under-layer 408 is preferably constructed of a polymeric material that can be cured at a relatively low temperature, such as around 150 to 250 degrees C. Examples of such polymeric materials include SIUL® (Shin-Etsu Chemical Co., Ltd.®), DURIMIDE® (Fujifilm Corporation®), JSR HM8006® (Honeywell International Inc.®), ACCUFLO T-31® (Honeywell International Inc.®) etc. The silicon containing hard mask 410 is preferably constructed of a Si containing hard mask material such as silicon oxide, silicon nitride, silicon oxynitride, silicon carbide or silicon containing organic material such as SIHM® (Shin-Etsu Chemical Co., Ltd.®), UVAS® (Honeywell International Inc.®) etc.

An optional Bottom Anti-Reflective Coating (BARC, not drawing here) may be applied over the silicon containing hard mask 410. The determination of whether a BARC layer is needed depends on the requirements of the photolithography and on the material used for the silicon containing hard mask 410. For example, if the hard mask 410 itself is a material that acts as a BARC, then no BARC layer is needed. Such materials include silicon oxynitride, SIHM® (Shin-Etsu Chemical Co., Ltd.®), UVAS® (Honeywell International Inc.®). However, some form of BARC is desirable to control photolithography parameters such as reflectivity swing and photo critical dimensions if the inorganic silicon containing hard mask such as silicon oxide, silicon nitride or silicon carbide is used as hard mask 410. Although there are number of ways to combine the under-layer materials with silicon containing hard mask, SiHM can provide both hard mask and BARC functions and can also be coated easily by a spin coating method.

Figure 5:
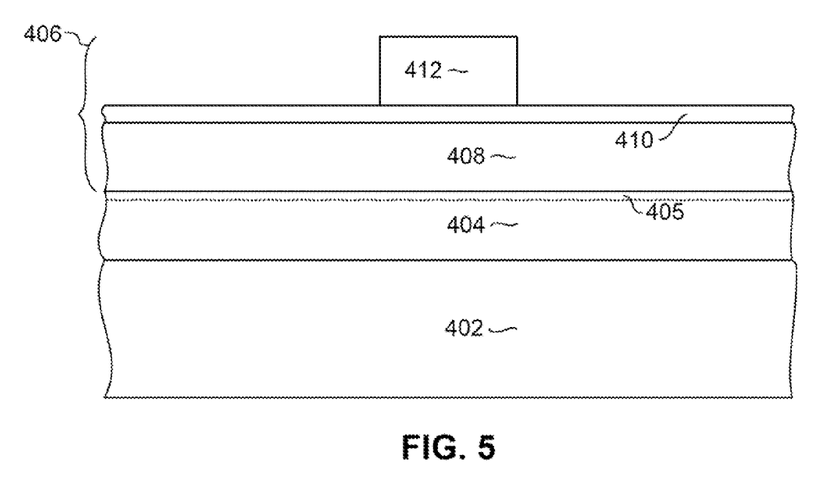

With reference now to FIG. 5, a photolithographic patterning process is performed to pattern the photoresist layer leaving the photoresist mask 412 as shown in FIG. 5. The photoresist material can be a material such as UV-110® manufactured by Shipley® or JSR1891® manufactured by JSR Corporation® and is preferably deposited to a thickness of 150 to 250 nm. The SiHM 410 functions as an excellent Bottom Anti-Reflective Coating (BARC) to improve the resolution of the photolithographic process used to define the photoresist mask 412. This results in the photoresist mask being formed with very well defined sides and a very accurate and narrow width. Using this process, the photoresist mask 412 can be patterned to have a width of about 40 nm with a sigma of less than 1.2. The line width roughness can be about 5 nm or less.

The selection of the photoresist thickness should be carefully considered such that it not only provides the best control and uniformity of critical dimensions (CD) after the photolithographic process but also provides proper thickness for the SiHM hard mask RIE process. If the thickness of photoresist is too thin or its etch rate selectivity is too low, oxygen may reduce the photoresist thickness too much during RIE process, thereby affecting the quality of the formed mask. If the thickness of photoresist is too thick, there will be too much photoresist left over after the SiHM RIE, raising the possibility that the photoresist cannot be completely removed after the second UL RIE, and the photoresist residues will cause fluctuation of the stencil height and affect the subsequent ion mill quality and thus the performance and the yield of the formed read sensors. For this reason, the photoresist thickness must be sufficiently considered and calculated to a proper value to make the photoresist serves as good mask during the first SiHM RIE process.

The final formed mask, which will serve as ion mill mask during the subsequent ion mill process to shape the sensor film stack into desired sensor shape, has height limitations. There are at least three factors limit the stencil height, the CD of the stencil, the ion mill shading effect and lift-off of the under-layer in the field area after the hard-bias deposition. For advanced magnetic read sensors, the stencil critical dimension (CD) is so narrow (as mentioned above the stencil CD after the second RIE is about 30 nm) that it can not support tall stencil structure as the under-layer is the relative soft polymeric material such as durimide. If the stencil height is so tall that it is beyond the support ability of the under-layer, the stencil will fall and ruin the mask. An ion mill shading effect is created from the ion beam angle relative to the wafer surface, which might not be normal to the wafer surface. In addition, the ion beam can have a certain amount of divergence causing the ion mill to be different across the stencil mask (in-bound/out-bound) and produce non-uniform sensor shape or defective shape so as to affect or ruin the performance of the sensor. If the under-layer is too thin, the lift-off process after the deposition of insulation and hard bias materials would be difficult. It would cause in-complete lift-off and leave residues, and these residues would cause troubles such as scratches in the subsequent CMP process and damage to the already formed sensors. We have found that the proper under-layer thickness between 60 to 120 nm, and Si containing hard mask thickness between 10 to 50 nm would satisfy most of the requirements discussed above. The corresponding thickness of the photoresist is between 150 to 250 nm. If silicon dielectric such as silicon oxide, silicon nitride, silicon oxynitride or silicon carbide are used for the hard mask, then the thickness of the hard mask layer can be much thinner (about 10 to 20 nm) since these materials have high selectivity to reactive ion etching in an oxygen plasma as compared with the under-layer. If the silicon containing hard mask like SIHM® (Shin-Etsu Chemical Co., Ltd.®) or UVAS® (Honeywell International Inc.®) are used as hard mask materials, then the thickness of the hard mask layer can be a little thicker (about 20 to 50 nm) due to these materials' relatively lower selectivity to reactive ion etching in an oxygen plasma as compared with the under-layer.

Figure 6:
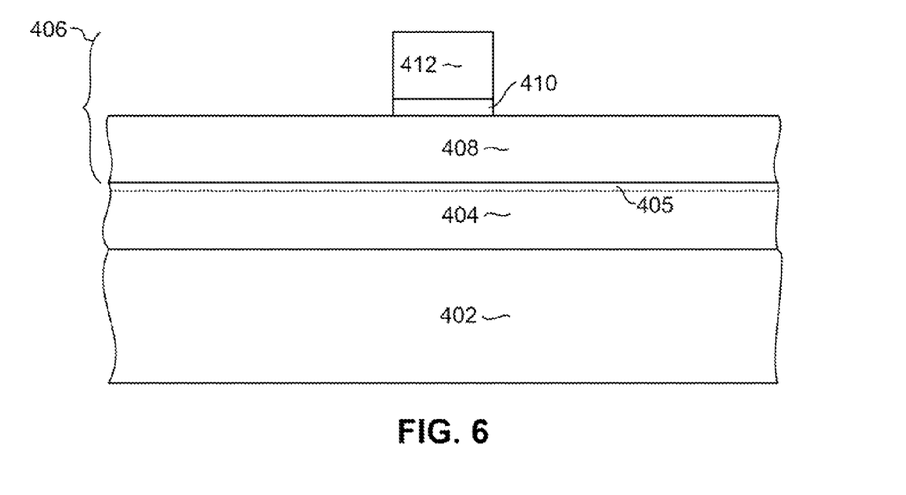

With reference to FIG. 6, a first reactive ion etching process (1st RIE) is performed to transfer the pattern of the photoresist mask 412 onto the under-lying SiHM 410 by removing portions of the SiHM 410 that are not protected by the photoresist mask 412. This RIE is a novel RIE that is performed in a fluorine based chemistry that includes four gases: $CF_4$, $CHF_3$, $O_2$ and He. The ratio of these gases is preferably about: 5 parts $CF_4$; 4 parts $CHF_3$; 2 parts $O_2$; and 3 parts He. This first reactive ion etching reduces the width of the photoresist mask 412 and hard mask 410 relative to the width of the as patterned photoresist mask 412 described above with reference to FIG. 5. The width can be reduced about 3 to 5 nm (e.g. to a width of about 37 to 35 nm), with a sigma of less than 1 nm and a line width roughness of less than about 4 nm.

One plasma tool especially suitable for the first fluorine based RIE process to etch the Si containing hard mask material is Plasma-Therm's® Versalock® (etcher, which is an inductively coupled plasma (ICP) etch system in which the plasma is generated by means of inductively coupling 2 MHz RF power (the source power) while independently controlling the ion energy directed toward the substrate via 13.56 MHz bias power. This separate power control allows a wider range of RIE processes to be performed, ranging from highly chemical processes to highly physical processes. The Versalock® etcher is equipped with Optical Emission Spectrometry (OES) endpoint system that the over-etch amount can be precisely controlled via the determination of etch endpoint.

Many Other ICP etchers equipped with both source and bias power suppliers, such as TCP9400DFM® from Lam Research Inc.®, or DPS® from Applied Materials Inc.®, can also be used for the RIE process of the Si containing hard mask material. It is expected that the RIE process presented here can be transferable transparently in different ICP etchers by doing minor tuning of the RIE parameters.

Generally, to use dry plasma to etch silicon containing materials such as SiHM with certain controllable CD bias (the difference between photoresist CD before SiHM RIE and the SiHM hard mask CD after the SiHM RIE), the plasma chemistry is basically fluorine containing gases (such as $CF_4$, $CHF_3$). The different combination of gas flow between $CF_4$ and $CHF_3$ can have different CD bias on SiHM hard mask, the CD bias can be either positive (i.e. the photoresist mask have greater CD than the SiHM hard mask CD), or negative (i.e. the photoresist CD is smaller than the SiHM hard mask CD). Since it is necessary to develop a very narrow track width (TW) read head, and the lithography tool could not produce the narrow enough TW as required by the design, the RIE process is not only used for transferring the photoresist mask pattern onto the SiHM hard mask layer but is also useful for reducing the CD to satisfy the design requirement. Usually, when the gas flow ratio of the $CF_4/CHF_3$ is more than a certain value (depending on the brand and type of the RIE equipment) such as about 1, the CD bias is positive and the higher the $CF_4/CHF_3$ ratio the greater the positive CD bias. However, the CD bias may not be sufficient even for only using pure $CF_4$ gas (without any $CHF_3$ gas), thus oxygen gas can be introduced to assist the shrinkage of the SiHM hard mask CD. The addition of oxygen gas can effectively reduce the SiHM hard mask CD, and the greater the oxygen gas flow the more the SiHM hard mask CD reduction. Besides oxygen gas, another gas such as Helium (He) can be introduced to dilute the etchants in the plasma and provide leaner chemistry. Since He has much less physical etching effect on the shoulder areas of the SiHM hard mask 410 compared with all other gases used, the addition of He gas provides a beneficial effect on the side wall profile of the SiHM hard mask 410. A ratio of about 1:3 or less between He and all other gases should be used, too much helium gas may make it difficult to strike and maintain a stable plasma due to the very low ionization ability of helium atoms.

The CD bias as well as its uniformity in the etching the Si containing hard mask 410 (FIG. 6) can be adjusted using the aforementioned etching gases along with the other parameters such as bias power, source power, amount of over etch, chamber pressure, the temperature of the wafer (or the temperature of the chuck on which the wafer is held) and backside helium cooling pressure. Besides the CD bias and its uniformity control, the adjustment of the above mentioned parameters can also be used for other purposes, for example, improving or reducing the etch rate selectivity between the photoresist 412 and SiHM hard mask 410, tuning side wall profile of the SiHM hard mask 410, changing etch rate and its uniformity, etc. Usually, the temperature of the wafer and backside helium cooling pressure have only a minimum effect on the out-coming results and are also not so convenient to adjust due to the restriction of tool sharing with many other production processes and thus usually remain as constants.

The most effective mechanism for reducing the CD of the SiHM hard mask 410 are the ratio between two gas flows (i.e. $O_2$ gas flow to $CHF_3$ gas flow or O/F ratio) and the ratio between two powers (i.e. source power to bias power). Our results showed that, the CD bias of the SiHM hard mask 410 increases linearly with the increase of O/F ratio in a range from 0.1 to 1.0 with all other parameters are fixed, and the SiHM hard mask CD bias also increases linearly with the increase of power ratio in a range from 5 to 30 when all other parameters have been fixed. On one hand, since the photoresist mask 412 is a polymeric material which easily react with oxygen ions and radicals, higher O/F ratio means there are more oxygen ions and radicals in the plasma and they tend to etch more on the side wall of the photoresist mask 412 and shrink the CD of the photoresist mask thus to reduced the CD of the SiHM hard mask 410; on the other hand, more oxygen ions and radicals in the plasma can better clean the fluorinated polymer formed by $CHF_3$ plasma, and make it much easy for the fluorine ions and radicals to etch the side wall of the SiHM thus to more readily reduce CD on SiHM hard mask 410. Therefore, the greater the O/F ratio applied, the larger SiHM hard mask CD bias becomes. The lower O/F ratio means less oxygen ion and radicals to shrink the photoresist mask CD and to clean up the polymers formed by the $CHF_3$ plasma, so both side walls of the photoresist mask 412 and SiHM hard mask 410 are less etched as a result of the smaller SiHM hard mask CD bias. Higher power-ratio means more source power which generates more non-directional ions, which tends to have more isotropic etching effect, and will etch side wall more strongly so that the SiHM hard mask 410 CD tends to shrinks more. Lower power-ratio means more bias power which creates more directional moving ions and tends to result in more anisotropic etching (i.e. vertical downward etching), giving rise to more physical etching (bombardment) and resulting in the mask 410 having less CD shrinkage thus smaller CD bias.

Although a certain CD bias can be realized through tuning of a single parameter such as either O/F ratio or power ratio, in most of the cases, it is much more convenient and easy to combine the tuning of two parameters together to arrive at the desired target. The reason is that using only a single tuning knob may create unwanted side effects. For example, the high O/F ratio produces great CD bias, but also creates low photoresist selectivity which may not leave enough photoresist to function as mask in the SiHM RIE process. In this case, increased power ratio can give extra CD bias without the need to have too high O/F ratio and its corresponding loss of selectivity. For another example, too high or too low power ratio may cause the power to exceed the hardware limits of the RIE equipment. In this case, the O/F ratio can be adjusted in a certain range to tune the CD bias to a desired value. In addition, to obtain a good SiHM hard mask, there are many other features and characteristics that have to be realized. Plus both the hardware operation reliability and process stability are of concern, it is better to combine the effects of the several tuning parameters to gets desired SiHM hard mask 410. Besides the first order tuning parameters (i.e. O/F ratio and power ratio), there are two second order factors having effect on the CD bias of the SiHM hard mask 410 including chamber pressure and amount of the over etch. The total chamber pressure can be in a lower range from 2 to 10 mT (milli-Torr) which provides a good CD bias uniformity and etch rate uniformity. The amount of the over etch is about from 20% to 50% which provides sufficient over etch to cover the film non-uniformity and the RIE tool variation. By carefully balancing these RIE process parameters, it is possible to obtain a SiHM hard mask 410 with required CD bias along with other desired features including straight side wall profile; good CD uniformity throughout wafer; less shoulder rounding at the top of SiHM hard mask 410; no footing or undercut at the bottom of the SiHM hard mask 410; sufficient remaining photoresist; and etc.

Figure 7:
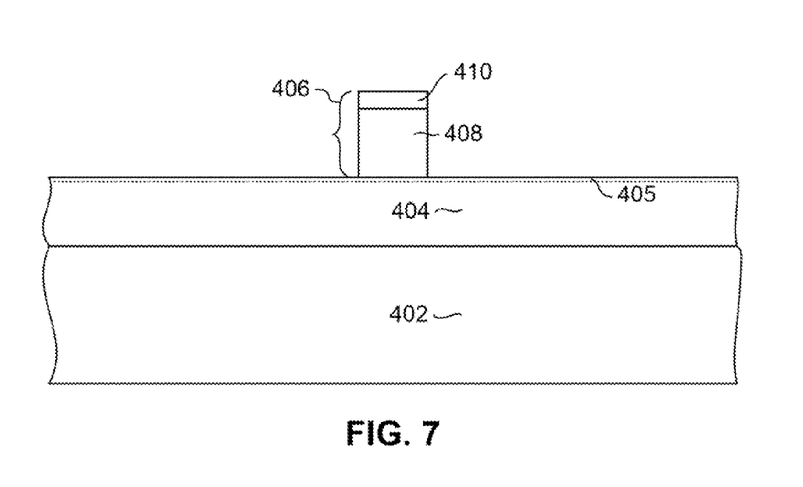

With reference now to FIG. 7, a second reactive ion etching (2nd RIE) is performed to transfer the image of the SiHM hard mask 410 onto the under-layer 408. This second RIE is preferably performed using an oxygen based chemistry, which is preferably predominantly $CO_2$. This second RIE further reduces the width of the layers 408, 410. The width can be reduced about another 5 to 7 nm (e.g. to about 32~28 nm), with a sigma of less than 1 nm and a line width roughness of around 3.5 nm. The variation of stencil height (the sum of the height of the SiHM hard mask 410 and the height of the under-layer mask 408) is small within wafer and from wafer to wafer due to the high etch selectivity of the SiHM 410 to under-layer 408 in the $CO_2$ based second RIE. The use of $CO_2$ (rather than $O_2$) in this second RIE process reduces the shoulder undercut and makes the side wall more vertical due to its gentler isotropic etching. Further, the power ratio (i.e. the source power to bias power), can be tuned to adjust the side wall profile of the under-layer mask 408 such as to reduce shoulder undercut and bottom footing. The range of the power ratio can be from 0.4 to 2.5. The ratio between the width of the top portion of the under-layer 408 (where shoulder under-cut occurs) to the width of the bottom portion of the SiHM 410 increases linearly with decreasing power ratio, which means the undercut at the top of the under-layer is reduced as power ratio decreases. The ratio between the width of the bottom of the under-layer 408 to the width of the middle portion of the under-layer 408 is also reduced with decreasing power ratio, which means that bottom footing can be reduced by decreasing the power ratio.

Lower power-ratio means more bias power (or less source power) which creates more directional moving ions and tends to have stronger anisotropic and weaker isotropic etching (i.e. more vertical downward etching and less horizontal etching) and gives rise to more physical etching (bombardment), resulting in the mask 410 having less undercut at top of the under-layer and less footing at the bottom of the under-layer, causing the under-layer mask 408 to have a more uniformed vertical profile. The CD of the under-layer mask is affected by the over-etch amount. The more over-etch that is applied, the smaller the under-layer CD becomes due to the longer under-layer etch. Though the etch selectivity of SiHM hard mask 410 to under-layer 408 is high, it is still limited in that more over-etch means more loss of the SiHM hard mask thus the shorter stencil height. The track width of the formed under-layer mask after the second RIE is affected by the power and the amount of the over etch. The higher the power ratio, the more isotropic the etching will be, and the more the side wall of the under-layer mask will be etched. This reduces the critical dimension (e.g. width), resulting in a smaller final CD of the under-layer mask 408. The longer over etch, the more side wall etch, resulting in smaller under-layer mask CD. A 20% to 50% over etch is enough to cover the variation due to the film uniformity and tool variation.

Figure 8:
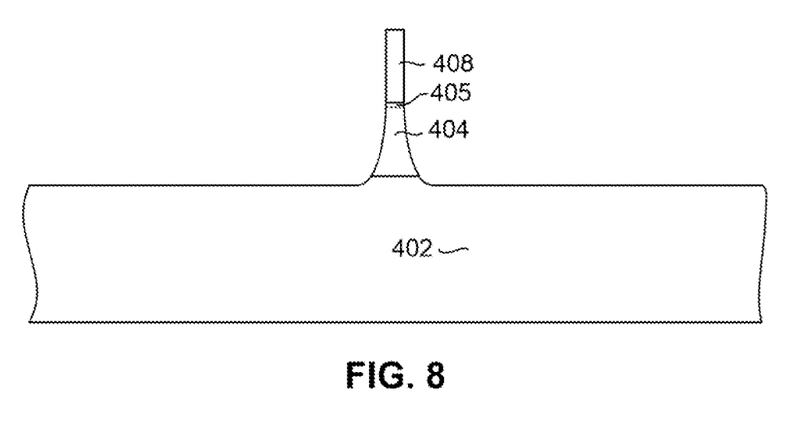

With reference to FIG. 8, an ion milling is performed to remove portions of the sensor material 404 that are not protected by the patterned mask under-layer 408 to define a sensor track-width. This ion milling even further reduces the width of the sensor 404 and under-layer 408 to form a very narrow sensor with well defined side walls. The ion milling can reduce the width by about 0 to 10 nm (e.g. to a final width of about 30 to 20 nm, depending on the sensor design requirement). Because the above first and second RIE processes provide significant width reduction, less width reduction needs to be provided by this ion milling process.

Figure 9:
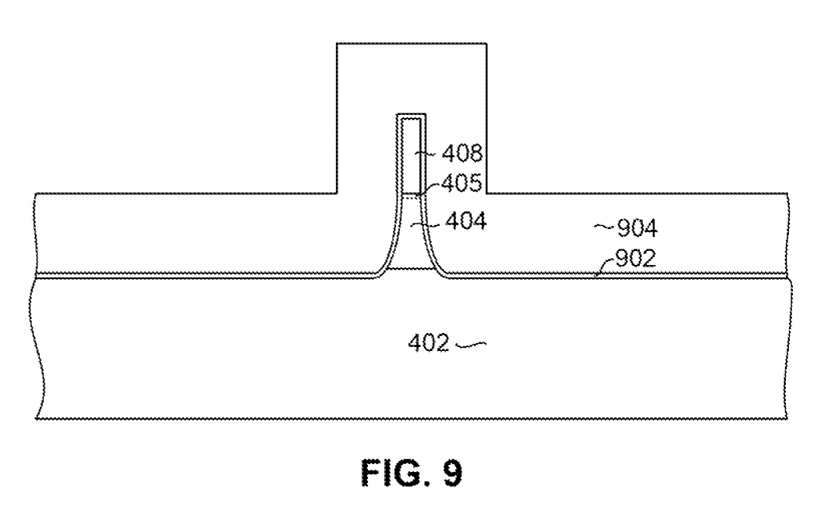

With reference now to FIG. 9, a thin layer of electrically insulating material 902 is deposited. This layer 902 can be alumina or silicon nitride and can be deposited by atomic layer deposition (ALD). Then, a layer of high coercivity magnetic material such as CoPt or CoPtCr 904 is deposited over thin insulation layer 902.

Figure 10:
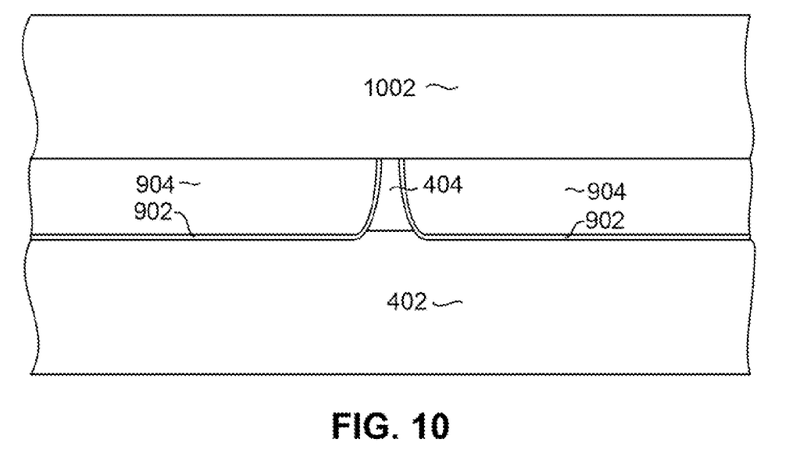

After a wet liftoff process to lift off the under-layer and the layer above the under-layer in the filed area (not drawn in the figures), a chemical mechanical polishing process can then be performed to planarize the structure and remove the remaining under-layer material 408. After performing the chemical mechanical polishing, the CMP stop layer 405 can be removed such as by reactive ion etching. A magnetic material 1002 can then be deposited (or electroplated) over the sensor 404 to provide an upper magnetic shield/lead, leaving a structure as shown in FIG. 10.

The novel tri-layer mask structure and novel two-step RIE process described above provides many advantages to forming a very narrow well defined sensor, especially with regard to the novel four gas first RIE process (i.e. $CF_4$, $CHF_3$, $O_2$ and He). First, the process produces a symmetrical and vertical mask structure with very little shoulder undercut, less bottom footing and with a smooth side wall. This allows for the formation of a very well defined sensor 404 via the ion milling process described above with reference to FIG. 8. The process allows for excellent control of sensor critical dimensions (e.g. track-width). A track-width shrinkage of total about 20 nm can be achieved by accumulating the results of the three step operations (i.e. first SiHM hard mask RIE, second under-layer RIE and third ion mill process). Using these processes, a sensor track-width of 20 nm or less can be obtained and well controlled, which had been previously unattainable.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetic sensor, the method comprising:
   depositing a series of sensor layers;
   depositing a series of mask layers over the series of sensor layers, the series of mask layers including an under-layer, a Si containing hard mask layer deposited over the under-layer and a photoresist layer deposited over the Si containing hard mask;
   photolithographically patterning the photoresist layer to form a photoresist mask;
   performing a first reactive ion etching to transfer the image of the photoresist mask onto the Si containing hard mask layer to form a patterned hard mask, the first reactive ion etching being performed in a chemistry that includes $CF_4$, $CHF_3$, $O_2$, and He;
   performing a second reactive ion etching to transfer the image of the patterned hard mask onto the under-layer to form a patterned under-layer; and then
   performing an ion milling to remove portions of the series of sensor layers that are not protected by the patterned under-layer.

2. The method as in claim 1 wherein the second reactive ion etching is performed in an oxygen based chemistry.

3. The method as in claim 1 wherein the second reactive ion etching is performed in a chemistry that contains $CO_2$.

4. The method as in claim 1 wherein the under-layer comprises polymeric materials or polyimide.

5. The method as in claim 1 wherein the Si containing hard mask comprises silicon oxide, silicon nitride, silicon oxynitride, silicon carbide or a silicon containing organic material.

6. The method as in claim 1 wherein the Si containing hard mask has a thickness of about 10 to 50 nm.

7. The method as in claim 1 further comprising, after performing the ion milling:
   depositing an electrically insulating layer; and
   depositing a magnetic layer over the electrically insulating layer.

8. The method as in claim 1 further comprising, after performing the ion milling:

depositing an electrically insulating layer;
depositing a magnetic layer over the electrically insulating layer;
performing a chemical mechanical polishing; and
forming a top magnetic shield.

9. The method as in claim 1 wherein the first reactive ion etching is performed in a chemistry that has a gas flow ratio O/F from 0.1 to 1.

10. The method as in claim 1 wherein the first reactive ion etching is performed with a source power/bias power ratio of from 5 to 30.

11. The method as in claim 1 wherein the first reactive ion etching is performed with a chamber pressure can be in a lower range from 2 to 10 mT.

12. The method as in claim 1 wherein the first reactive ion etching is performed with a over etch about from 20% to 50%.

13. The method as in claim 1 wherein the series of sensor layers further comprises a CMP stop layer as its topmost layer.

14. The method as in claim 13 wherein the CMP stop layer comprises alumina or carbon.

15. The method as in claim 1 wherein the second reactive ion etching is performed in a chemistry that contains greater than 50 percent $CO_2$.

16. The method as in claim 15 wherein the second reactive ion etching is performed with a source power/bias power ratio of from 0.4 to 2.5.

17. The method as in claim 15 wherein the second reactive ion etching is performed with a over etch about from 20% to 50%.

* * * * *